US012134143B2

(12) United States Patent
Hadano

(10) Patent No.: US 12,134,143 B2
(45) Date of Patent: Nov. 5, 2024

(54) LASER PROCESSING MACHINE

(71) Applicant: DISCO CORPORATION, Tokyo (JP)

(72) Inventor: Yuji Hadano, Tokyo (JP)

(73) Assignee: DISCO CORPORATION, Tokyo (JP)

(*) Notice: Subject to any disclaimer, the term of this patent is extended or adjusted under 35 U.S.C. 154(b) by 430 days.

(21) Appl. No.: 17/647,073

(22) Filed: Jan. 5, 2022

(65) Prior Publication Data

US 2022/0219263 A1 Jul. 14, 2022

(30) Foreign Application Priority Data

Jan. 12, 2021 (JP) ................................ 2021-002679

(51) Int. Cl.

| | |
|---|---|
| ***B23K 26/40*** | (2014.01) |
| ***B23K 26/06*** | (2014.01) |
| ***B23K 26/0622*** | (2014.01) |
| ***B23K 26/073*** | (2006.01) |
| ***B23K 26/146*** | (2014.01) |
| ***B23K 103/00*** | (2006.01) |
| ***H01L 21/67*** | (2006.01) |

(52) U.S. Cl.

CPC .......... *B23K 26/40* (2013.01); *B23K 26/0622* (2015.10); *B23K 26/0643* (2013.01); *B23K 26/0665* (2013.01); *B23K 26/0736* (2013.01); *B23K 26/146* (2015.10); *H01L 21/67092* (2013.01); *B23K 2103/56* (2018.08)

(58) Field of Classification Search

CPC .. B23K 26/40; B23K 26/0622; B23K 26/146; B23K 26/0643; B23K 26/0665; B23K 26/0736; B23K 2103/56; H01L 21/67092

See application file for complete search history.

(56) References Cited

U.S. PATENT DOCUMENTS

2013/0001207 A1* 1/2013 Nomaru ............... B23K 26/364 219/121.75
2019/0122907 A1* 4/2019 Hadano ................ B23K 26/032

FOREIGN PATENT DOCUMENTS

| | | | |
|---|---|---|---|
| DE | 102013208833 | A1 | 11/2013 |
| DE | 102015219015 | A1 | 4/2016 |
| DE | 102020207623 | A1 | 12/2020 |
| JP | 2005064231 | A | 3/2005 |
| JP | 2017064736 | A | 4/2017 |

OTHER PUBLICATIONS

Office Action issued in counterpart German patent application No. 10 2022 200 023.4, dated Feb. 14, 2024.

* cited by examiner

*Primary Examiner* — Marc Anthony Armand
(74) *Attorney, Agent, or Firm* — Greer Burns & Crain Ltd.

(57) ABSTRACT

A laser beam application unit of a laser processing machine includes a laser oscillator, a spot shaper, a polygon mirror, and a condenser. The laser oscillator emits a pulsed laser beam. The spot shaper is configured to shape a spot profile of the pulsed laser beam emitted from the laser oscillator such that the spot profile becomes long in a Y-axis direction and short in an X-axis direction. The polygon mirror disperses the spot, which has been shaped by the spot shaper, in the X-axis direction. The condenser focuses the pulsed laser beam, which has been dispersed by the polygon mirror, on a workpiece held on a chuck table.

3 Claims, 5 Drawing Sheets

LASER PROCESSING MACHINE

BACKGROUND OF THE INVENTION

Field of the Invention

The present invention relates to a laser processing machine that applies a pulsed laser beam to a workpiece which is held on a chuck table, to process the workpiece.

Description of the Related Art

A semiconductor wafer with a plurality of devices such as integrated circuits (ICs) or large-scale integration (LSI) circuits formed in a front surface thereof divided by a plurality of intersecting streets is singulated into individual device chips by a laser processing machine or a dicing machine, and the thus-singulated device chips are used in electrical equipment such as mobile phones or personal computers.

The devices are formed of a plurality of circuit layers stacked on the front surface of the semiconductor wafer, and an insulating layer of low dielectric constant (low-k film) is also stacked on the streets. When the streets are cut by a cutting blade of the dicing machine, peeling of the insulating layer may occur, and may then spread to the circuit layers, so that the devices may be damaged. Before cutting the semiconductor wafer by the cutting blade, a laser beam is therefore applied along each street to form a plurality of laser-processed grooves at a predetermined interval therebetween in an indexing direction (Y-axis direction). The insulating layer that still remains between the laser-processed grooves is cut by the cutting blade. As the remaining insulating layer has been cut off at both sides, its cutting does not give any effect to the circuit layers (see, for example, JP 2005-064231A).

SUMMARY OF THE INVENTION

With the technique described in JP 2005-064231A cited above, however, there is a need to perform the application of the laser beam by repeatedly moving the wafer, which is held on a chuck table, and a laser beam application unit relative to each other in an X-axis direction such that the plurality of laser-processed grooves is formed for each single street, thereby leading to a problem of low productivity.

The present invention therefore has as an object thereof the provision of a laser processing machine that can effectively remove an insulating layer from each street.

In accordance with an aspect of the present invention, there is provided a laser processing machine including a chuck table configured to hold a workpiece, a laser beam application unit configured to apply a pulsed laser beam to the workpiece held on the chuck table, an X-axis direction feed mechanism configured to perform relative processing feed of the chuck table and the laser beam application unit in an X-axis direction, and a Y-axis direction feed mechanism configured to perform relative processing feed of the chuck table and the laser beam application unit in a Y-axis direction that intersects the X-axis direction at right angles. The laser beam application unit includes a laser oscillator that oscillates pulsed laser and emits a pulsed laser beam, a spot shaper configured to shape a spot profile of the pulsed laser beam emitted from the laser oscillator such that the spot profile becomes long in the Y-axis direction and short in the X-axis direction, a polygon mirror that disperses, in the X-axis direction, the spot which has been shaped by the spot shaper, and a condenser that focuses, on the workpiece held on the chuck table, the pulsed laser beam which has been dispersed by the polygon mirror.

Preferably, the workpiece may be a semiconductor wafer with a plurality of devices formed in a front surface thereof divided by a plurality of intersecting streets, and the spot profile which has been shaped at the spot shaper may have, in the Y-axis direction, a length corresponding to a width of the streets. Preferably, the laser beam application unit may further include a water film-forming unit configured to form a water film between the condenser and the workpiece held on the chuck table.

According to the laser processing machine of the present invention, the length in the Y-axis direction of the spot profile can be set corresponding to the width of the streets by the spot shaper, and the pulsed laser beam can be applied after dispersing it in the X-axis direction by the polygon mirror. The insulating layer can therefore be efficiently removed from each street, so that the productivity is improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will hereinafter be made in detail about a laser processing machine according to an embodiment of the present invention.

Figure 1:
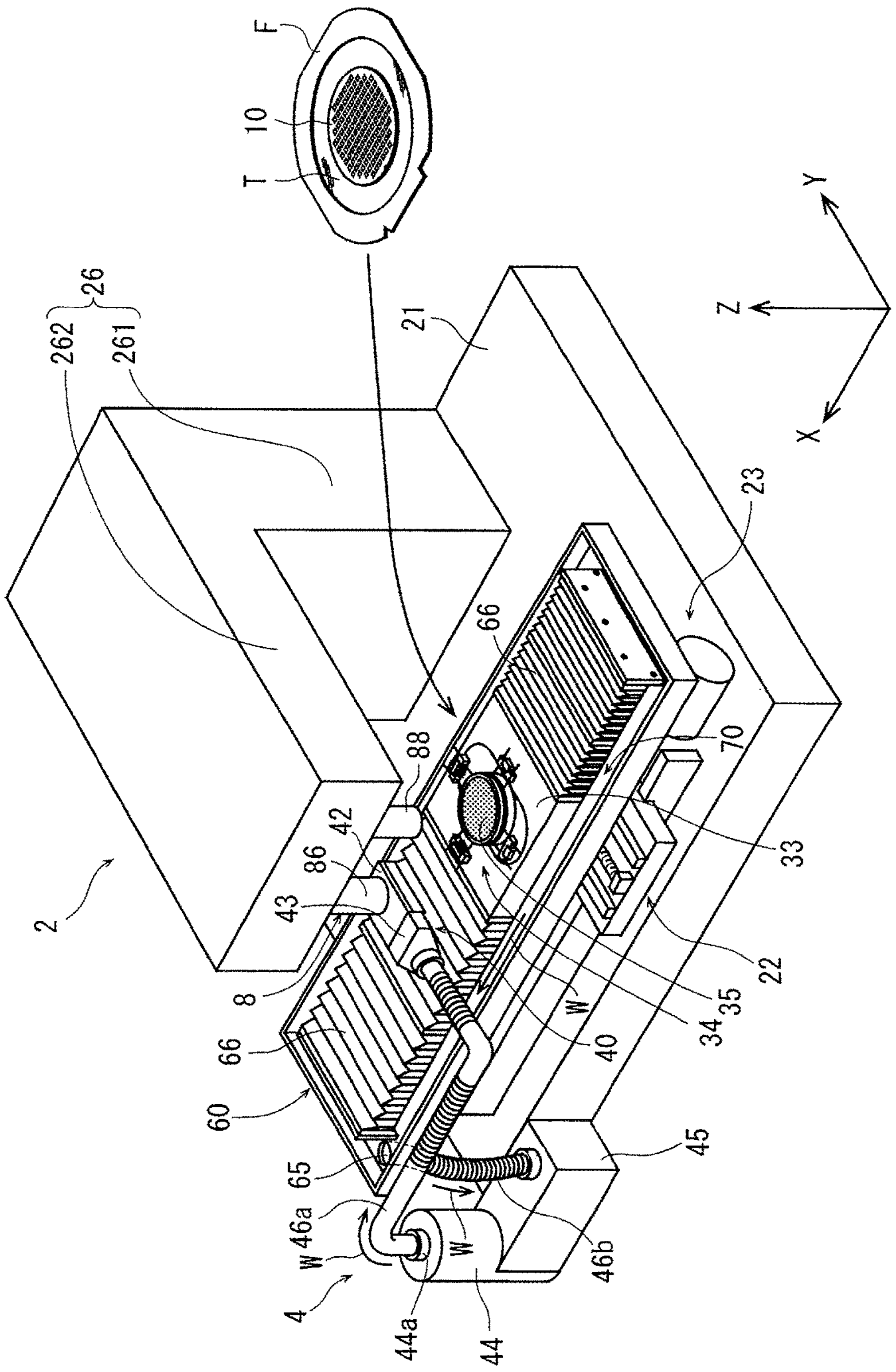
FIG. 1 is an overall perspective view of a laser processing machine according to an embodiment of the present invention.

FIG. 1 depicts an overall perspective view depicting a laser processing machine 2 of the present embodiment. The laser processing machine 2 includes a holding unit 22 disposed on a bed 21 and configured to hold a slice-shaped workpiece (for example, a silicon-made wafer 10), a moving mechanism 23 configured to move the holding unit 22, a frame body 26 formed from a vertical wall section 261, which is disposed upright in a Z-axis direction indicated by an arrow Z beside the moving mechanism 23 on the bed 21, and a horizontal wall section 262, which extends in a horizontal direction from an upper end portion of the vertical wall section 261, and a laser beam application unit 8. As depicted in the figure, the wafer 10 is supported, for example, on an annular frame F via an adhesive type T, and is held on the holding unit 22. Actually, the above-described laser processing machine 2 is covered in its entirety by a housing or the like a depiction of which is omitted in the figure for the convenience of description, and is configured to prevent penetration of fine powder, dust, and the like thereinto.

Figure 2:
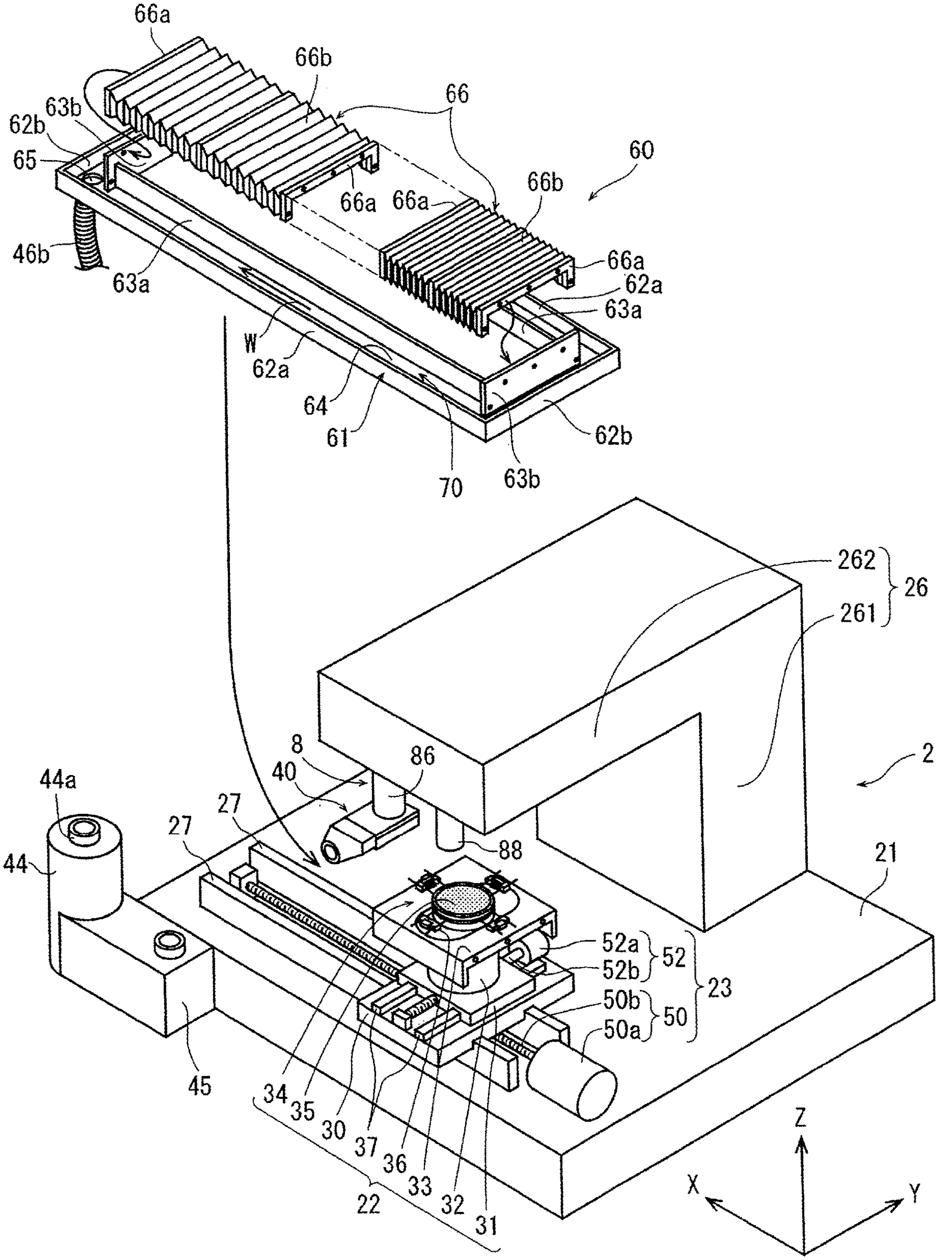
FIG. 2 is an exploded perspective view of the laser processing machine of FIG. 1, with a section of the laser processing machine being depicted in an exploded fashion.

In the laser processing machine 2 of the present embodiment, a water film-forming unit 4 may be disposed as needed in addition to the above-described configuration. The water film-forming unit 4 is configured to form a water film between a condenser 86 disposed in the laser beam application unit 8 and the wafer 10 held on the holding unit 22. FIG. 2 is a perspective view depicting the laser processing machine 2 of FIG. 1, in which a water recovery pool 60 that configures a section of the water film-forming unit 4 has been detached from the laser processing machine 2 and a part of the detached section is depicted in an exploded fashion.

With reference to FIG. 2, the laser processing machine 2 according to the present embodiment will be described further. Inside the horizontal wall section 262 of the frame body 26, an optical system which will be described in detail subsequently herein is accommodated. The optical system configures the laser beam application unit 8 that applies a pulsed laser beam to the wafer 10 held on the holding unit 22. On the side of a lower surface of a distal end portion of the horizontal wall section 262, the condenser 86 that configures a portion of the laser beam application unit 8 is disposed, and an alignment unit 88 is also disposed at a location adjacent to the condenser 86 in an X-axis direction indicated by an arrow X in the figure. The alignment unit 88 is used to perform an alignment between the condenser 86 and a processing position on the wafer 10 by imaging the wafer 10 held on the holding unit 22 and detecting a region to which laser processing is to be applied.

The alignment unit 88 includes an imaging device (charge coupled device (CCD)) that uses a visible beam to image a front surface 10*a* (see FIG. 6A) of the wafer 10. Depending on the material that forms the wafer 10, the alignment unit 88 may preferably include infrared ray application means for applying an infrared ray, an optical system that captures the infrared ray applied by the infrared ray application means and reflected on the front surface 10*a* of the wafer 10, and an imaging device (infrared CCD) that outputs electrical signals corresponding to the infrared ray captured by the optical system.

The holding unit 22 includes a rectangular X-axis direction moving plate 30 mounted on the bed 21 movably in the X-axis direction, a rectangular Y-axis direction moving plate 31 mounted on the X-axis direction moving plate 30 movably in a Y-axis direction that is indicated by an arrow Y and that intersects the X-axis direction at right angles in FIG. 2, a cylindrical post 32 fixed on an upper surface of the Y-axis direction moving plate 31, and a rectangular cover plate 33 fixed on an upper end of the post 32. On the cover plate 33, a chuck table 34 is disposed extending upward through an elongated hole formed in the cover plate 33. The chuck table 34 is configured to hold the wafer 10 and to be rotatable by undepicted rotary drive means. On an upper surface of the chuck table 34, a suction chuck 35 is disposed. The suction chuck 35 has a circular shape, is formed from a porous material, and extends substantially horizontally. The suction chuck 35 is connected to an undepicted suction source via a flow passage that extends through the post 32, and four clamps 36 are arranged at equal intervals around the suction chuck 35. The clamps 36 grip the frame F with the wafer 10 held thereon when fixing the wafer 10 on the chuck table 34. A plane defined by the X-axis direction and the Y-axis direction forms a substantially horizontal plane.

The moving mechanism 23 includes at least an X-axis direction feed mechanism 50 and a Y-axis direction feed mechanism 52. The X-axis direction feed mechanism 50 is configured to perform relative processing feed of the holding unit 22 and the laser beam application unit 8 in the X-axis direction, and the Y-axis direction feed mechanism 52 is configured to perform relative processing feed of the holding unit 22 and the laser beam application unit 8 in the Y-axis direction. The X-axis direction feed mechanism 50 converts a rotary motion of a motor 50*a* to a linear motion via a ball screw 50*b*, and transmits the linear motion to the X-axis direction moving plate 30, whereby the X-axis direction moving plate 30 is advanced or retracted in the X-axis direction along guide rails 27 on the bed 21. The Y-axis direction feed mechanism 52 converts a rotary motion of a motor 52*a* to a linear motion via a ball screw 52*b*, and transmits the linear motion to the Y-axis direction moving plate 31, whereby the Y-axis direction moving plate 31 is advanced or retracted in the Y-axis direction along guide rails 37 on the X-axis direction moving plate 30. Although not depicted in the figures, the chuck table 34, the X-axis direction feed mechanism 50, and the Y-axis direction feed mechanism 52 each include position detecting means, and therefore positions of the chuck table 34 in the X-axis and Y-axis directions and an angular position of the chuck table 34 in a peripheral direction (rotation direction) are detected accurately. The X-axis direction feed mechanism 50, the Y-axis direction feed mechanism 52, and the undepicted rotary drive means for the chuck table 34 are then driven by a control unit a depiction of which is omitted in the figures, thereby enabling to accurately position the chuck table 34 at desired positions and angle.

With reference to FIGS. 1 to 3B, a description will be made about the water film-forming unit 4. As depicted in FIG. 1, the water film-forming unit 4 includes a water film former 40, a pump 44, a filter 45, the water recovery pool 60, a pipe 46*a* connecting the water film former 40 and the pump 44 to each other, and a pipe 46*b* connecting the water recovery pool 60 and the filter 45 to each other. Preferably, the pipe 46*a* and the pipe 46*b* may each be formed by a flexible hose in its part or entirety.

Figure 3A:
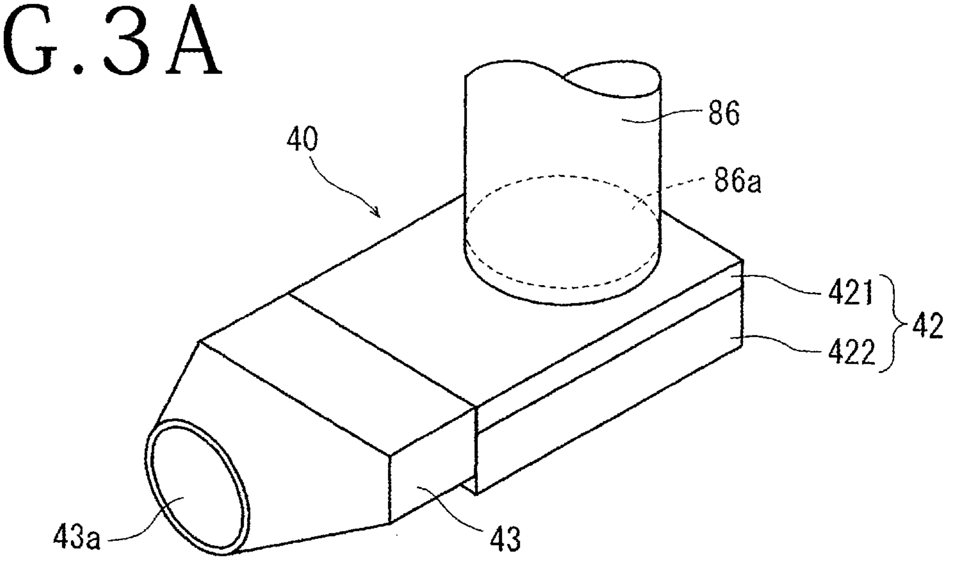
FIG. 3A is a perspective view of a water film-forming unit disposed in the laser processing machine of FIG. 1.
Figure 3B:
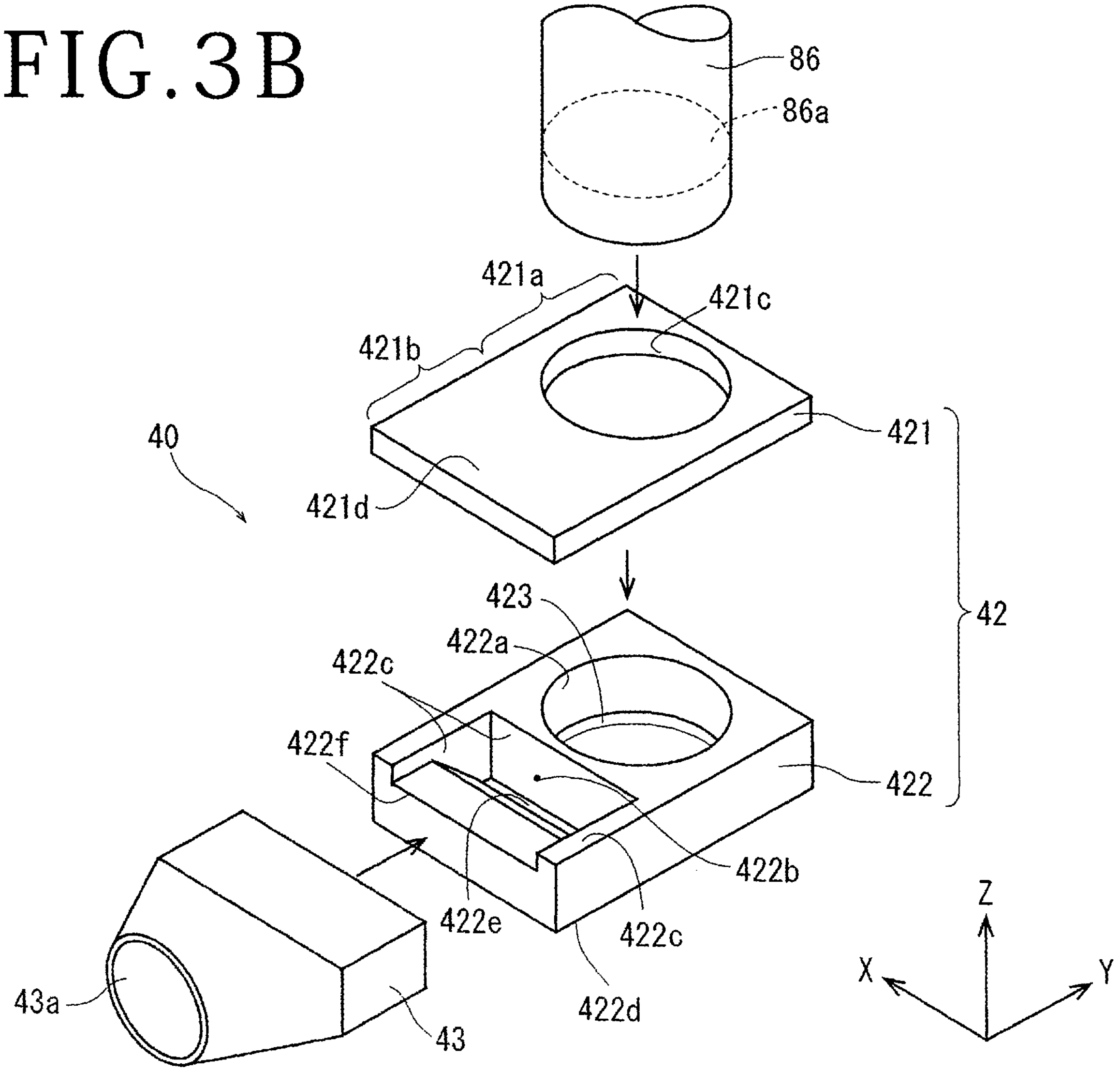
FIG. 3B is an exploded perspective view depicting, in an exploded fashion, the water film-forming unit of FIG. 3A.

As depicted in FIG. 3A, the water film former 40 is disposed on a lower end portion of the condenser 86. An exploded view of the water film former 40 is presented in FIG. 3B. As appreciated from FIG. 3B, the water film former 40 includes a casing 42 and a water supply portion 43. The casing 42 has a substantially rectangular shape as seen in plan, and is configured of an upper casing member 421 and a lower casing member 422.

The upper casing member 421 is divided into two portions 421*a* and 421*b* in the Y-axis direction indicated by the arrow Y in the figure, the portion 421*a* on the farther side in the figure defines a circular opening 421*c* for insertion of the condenser 86, and the portion 421*b* on the nearer side in the figure is formed as a plate-shaped portion 421*d*. In the lower casing member 422, a cylindrical opening 422*a* is formed in a region opposite the opening 421*c* of the upper casing member 421. The cylindrical opening 422*a* has the same shape as that of the opening 421*c*, and is coincident in disposed position with the opening 421*c* as seen in plan. The opening 422*a* includes a disc-shaped transparent portion 423 in a bottom portion thereof, and is closed by the transparent portion 423. The transparent portion 423 has characteristics that allow a pulsed laser beam LB, which will be described subsequently herein, to pass therethrough, and is formed, for example, from a glass plate.

In the lower casing member 422, a water flow channel portion 422*b* is formed in a region opposite the plate-shaped portion 421*d* of the upper casing member 421 to eject liquid (water W in the present embodiment) from a bottom wall 422*d* of the casing 42. The water flow channel portion 422*b* is a space formed by the plate-shaped portion 421*d* of the upper casing member 421, side walls 422*c*, and the bottom wall 422*d*. In the bottom wall 422*d* of the water flow channel portion 422*b*, a slit-shaped ejection port 422*e* is formed extending in the X-axis direction, and in a side wall on a side to which the water supply portion 43 is connected, a water supply port 422*f* is formed to supply the water W to the water flow channel portion 422*b*. The above-described transparent portion 423 has a lower surface formed in flush with the slit-shaped ejection port 422*e* which extends in a processing feed direction, and the transparent portion 423 forms a portion of the bottom wall 422*d* of the lower casing member 422.

The water supply portion 43 includes a supply port 43*a* through which the water W is supplied, a discharge port (a depiction of which is omitted in the figure) formed at a position opposite the water supply port 422*f* formed in the casing 42, and a communication channel (a depiction of which is omitted in the figure) which communicates the supply port 43*a* and the discharge port with each other. By assembling the water supply portion 43 to the casing 42 in the Y-axis direction, the water film former 40 is formed.

The water film former 40 has such a configuration as described above, and the water W delivered from the pump 44 is supplied to the casing 42 via the water supply portion 43, and is ejected from the ejection port 422*e* formed in the bottom wall 422*d* of the casing 42. As depicted in FIG. 1, the water film former 40 is attached to the lower end portion of the condenser 86 such that the water supply portion 43 and the casing 42 extend along the Y-axis direction. As a consequence, the ejection port 422*e* formed in the bottom wall 422*d* of the casing 42 is positioned to extend along the X-axis direction.

Referring back to FIG. 2, a description will be made about the water recovery pool 60. As depicted in FIG. 2, the water recovery pool 60 includes an outer frame member 61 and two water covers 66.

The outer frame member 61 includes a pair of outer side walls 62*a* extending in the X-axis direction, a pair of outer side walls 62*b* extending in the Y-axis direction, pairs of inner side walls 63*a* and 63*b* disposed on inner sides of and in parallel with the outer side walls 62*a* and 62*b* with a predetermined interval from the outer side walls 62*a* and 62*b*, and a bottom wall 64 connecting the outer side walls 62*a* and 62*b* and the inner side walls 63*a* and 63*b* together at lower ends thereof. The outer side walls 62*a* and 62*b*, the inner side walls 63*a* and 63*b*, and the bottom wall 64 form a rectangular water recovery channel 70 which has long sides extending along the X-axis direction and short sides extending along the Y-axis direction. On inner sides of the inner side walls 63*a* and 63*b* that form the water recovery channel 70, openings are formed extending vertically. The bottom wall 64 which forms the water recovery channel 70 has a slight inclination. At a corner portion located at a lowest position of the water recovery channel 70 (a left corner portion in the figure), a water drain hole 65 is disposed. The pipe 46*b* is connected to the water drain hole 65, so that the water drain hole 65 is connected to the filter 45 via the pipe 46*b*.

The two water covers 66 each include a resin-made bellows member 66*b* and fixtures 66*a* that have a flattened square U-shape and that are fixedly secured on opposite ends of the corresponding bellows member 66*b*. The fixtures 66*a* are formed with dimensions sufficient to straddle the two inner side walls 63*a* of the outer frame member 61, the two inner side walls 63*a* being disposed opposing each other in the Y-axis direction. One of the fixtures 66*a* of each bellows member 66*b*, specifically, the outer fixture 66*a* as viewed in the X-axis direction is fixed on the inner side wall 63*b* of the outer frame member 61, the inner side wall 63*b* being disposed opposing the outer fixture 66*a* in the X-axis direction. The water recovery pool 60 configured as described above is fixed on the bed 21 of the laser processing machine 2 by undepicted fixtures. The cover plate 33 of the holding unit 22 is attached such that the cover plate 33 is held between the inner fixtures 66*a* of the two bellows members 66*b*. Owing to the above-described configuration, the cover plate 33 moves along the inner side walls 63*a* of the water recovery pool 60 when the cover plate 33 is moved in the X-axis direction by the X-axis direction feed mechanism 50.

Figure 4A:
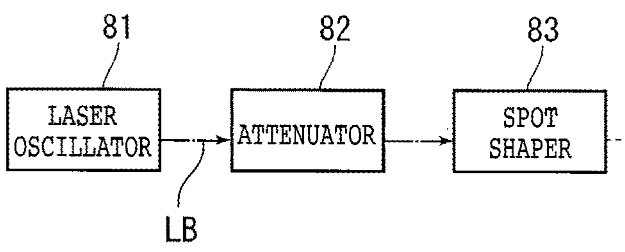
FIG. 4A is a block diagram illustrating an outline of an optical system of a laser beam application unit disposed in the laser processing machine depicted in FIG. 1.
Figure 4A:
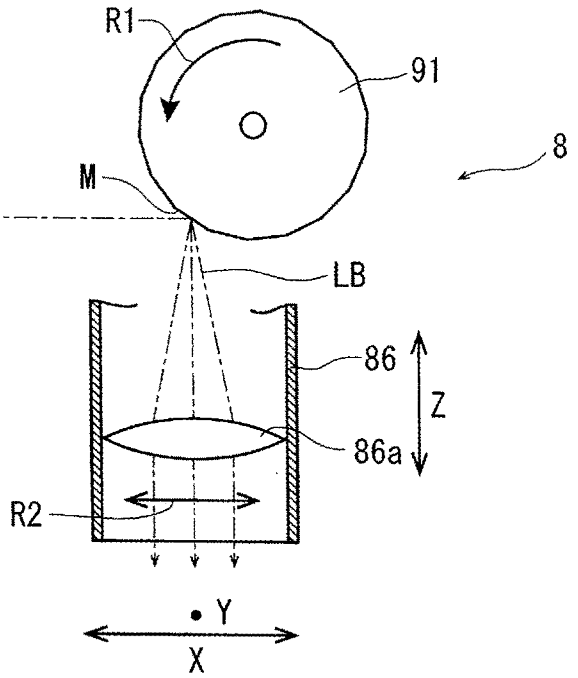
Figure 4B:
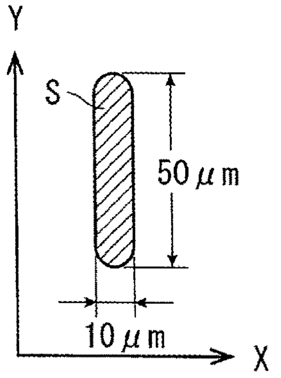
FIG. 4B is a plan view of a spot shaped by a spot shaper illustrated in FIG. 4A.

FIG. 4A depicts a block diagram illustrating an outline of the optical system of the laser beam application unit 8. As illustrated in FIG. 4A, the laser beam application unit 8 includes a laser oscillator 81, an attenuator 82, a spot shaper 83, a polygon mirror 91, and the condenser 86. The laser oscillator 81 emits the pulsed laser beam LB. The attenuator 82 adjusts as needed the output of the pulsed laser beam LB emitted from the laser oscillator 81. The spot shaper 83 is configured to shape the profile of a spot S of the pulsed laser beam LB emitted from the laser oscillator 81 such that, as illustrated in FIG. 4B, the spot profile S becomes long in the Y-axis direction and short in the X-axis direction on the holding unit 22. The polygon mirror 91 functions to disperse the spot S, which has been shaped by the spot shaper 83, in the X-axis direction on the holding unit 22. The condenser 86 focuses the pulsed laser beam LB, which has been dispersed by the polygon mirror 91 in the X-axis direction, on the wafer 10 held on the holding unit 22.

The polygon mirror 91 disposed in an upper part of the condenser 86 includes an unillustrated motor that rotates the polygon mirror 91 at a high speed (for example, 10,000 rpm) in a direction indicated by an arrow R1. Inside the condenser 86, a condenser lens (fθ lens) 86*a* is disposed to condense and apply the pulsed laser beam LB to the wafer 10. As illustrated in the figure, the polygon mirror 91 includes a plurality of mirrors M (18 mirrored facets in the present embodiment) on a side wall surface thereof, and has a polygonal shape as seen in side view. The condenser lens 86*a* is located below the above-described polygon mirror 91, condenses the pulsed laser beam LB reflected by the mirrors M of the polygon mirror 91 that is rotating in the direction indicated by the arrow R1, and applies the condensed pulsed laser beam LB to the wafer 10 on the chuck table 34. Owing to the rotation of the polygon mirror 91, the application angle of the pulsed laser beam LB reflected by the mirrors M continuously changes in a predetermined range, so that spot S formed by the pulsed laser beam LB is dispersed in a predetermined range in the X-axis direction indicated by an arrow R2.

As the spot shaper 83, a diffractive optical element (DOE) is adopted, for example. By the adoption of the DOE, a diffraction of the pulsed laser beam LB guided from the attenuator 82 is controlled such that, as illustrated in FIG. 4B, the profile of the spot S formed on the chuck table 34 of the holding unit 22 becomes long in the Y-axis direction and short in the X-axis direction. As the profile of the spot S, the dimensions in the X-axis direction and the Y-axis direction are set, for example, at 10 μm and 50 μm, respectively. It is to be noted that, corresponding to a width dimension (approximately 55 μm) of streets 14 dividing the front surface 10*a* (see FIG. 5) of the wafer 10, the streets 14 being to be described subsequently herein, this dimension of the length in the Y-axis direction is set as a dimension slightly smaller than the width dimension. In the embodiment described above, the DOE is adopted as the spot shaper 83. Without being limited to the DOE, however, the present invention can adopt another known technique that can shape the spot profile of the pulsed laser beam LB. Using, for example, a digital micromirror device (DMD), a spatial light modulator (SLM), a cylindrical lens, a mask, a phase plate, or the like as the known technique, the profile of the spot S of the pulsed laser beam LB can be changed to a desired profile.

In addition, the laser beam application unit 8 includes unillustrated focal point position adjusting means. Although an illustration of a specific configuration of the focal point position adjusting means in the figure is omitted, the focal point position adjusting means may be configured having, for example, a ball screw which includes nut portions fixed on the condenser 86 and extends in the Z-axis direction indicated by the arrow Z and a motor connected to one end portion of the ball screw. Owing to such a configuration, a rotary motion of the motor is converted to a linear motion, and the condenser 86 is moved along guide rails (an illustration of which is omitted in the figure) disposed in the Z-axis direction, whereby the position in the Z-axis direction of the focal point of the pulsed laser beam LB condensed by the condenser 86 is adjusted.

The laser processing machine 2 of the present embodiment has the configuration as generally described above, and its functions and operations will be described hereinafter.

Figure 5:
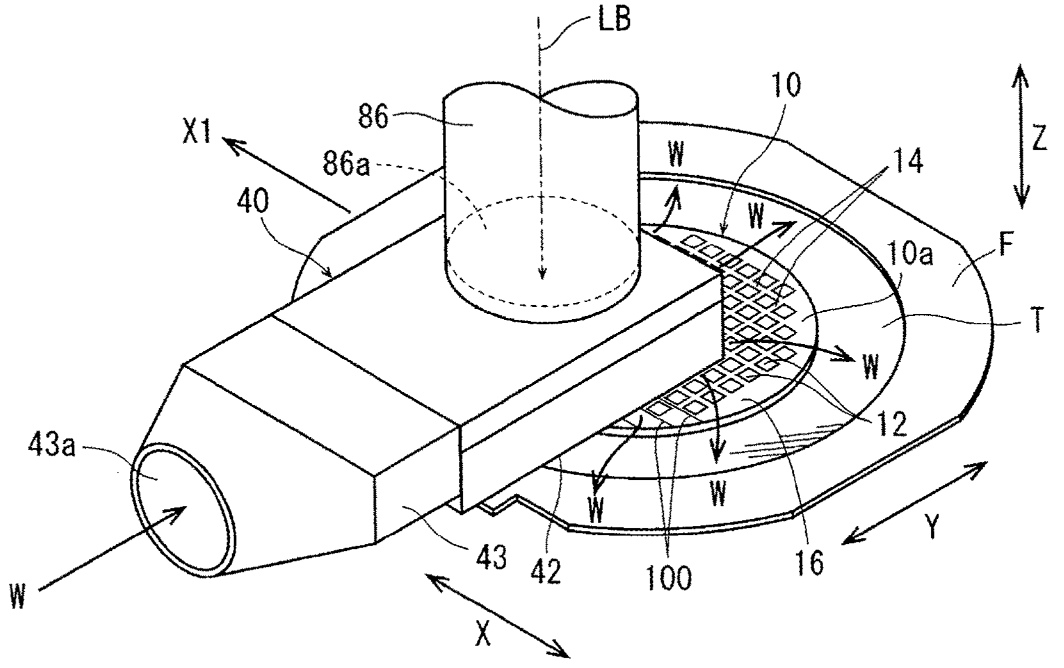
FIG. 5 is a perspective view illustrating how laser processing is applied to a wafer by the laser processing machine depicted in FIG. 1.

When laser processing by the laser processing machine 2 of the present embodiment is performed, the wafer 10 supported on the annular frame F via the adhesive tape T as depicted in FIG. 5 is provided. The wafer 10 is made of a silicon substrates, and carries a plurality of devices 12 formed in the front surface 10*a* divided by the streets 14. Over the streets 14 on the front surface 10*a* of the wafer 10, an insulating layer of low dielectric constant (low-k film) is stacked. After the wafer 10 has been provided, the wafer 10 is placed, with the front surface 10*a* facing upward, on the suction chuck 35 of the above-described chuck table 34. The wafer 10 is then fixed by the clamps 36, and at the same time the unillustrated suction source is operated to produce a suction force on the suction chuck 35, so that the wafer 10 is held under suction. It is to be noted that the chuck table 34, the suction chuck 35, and the clamps 36 are omitted in FIG. 5.

Figure 6A:
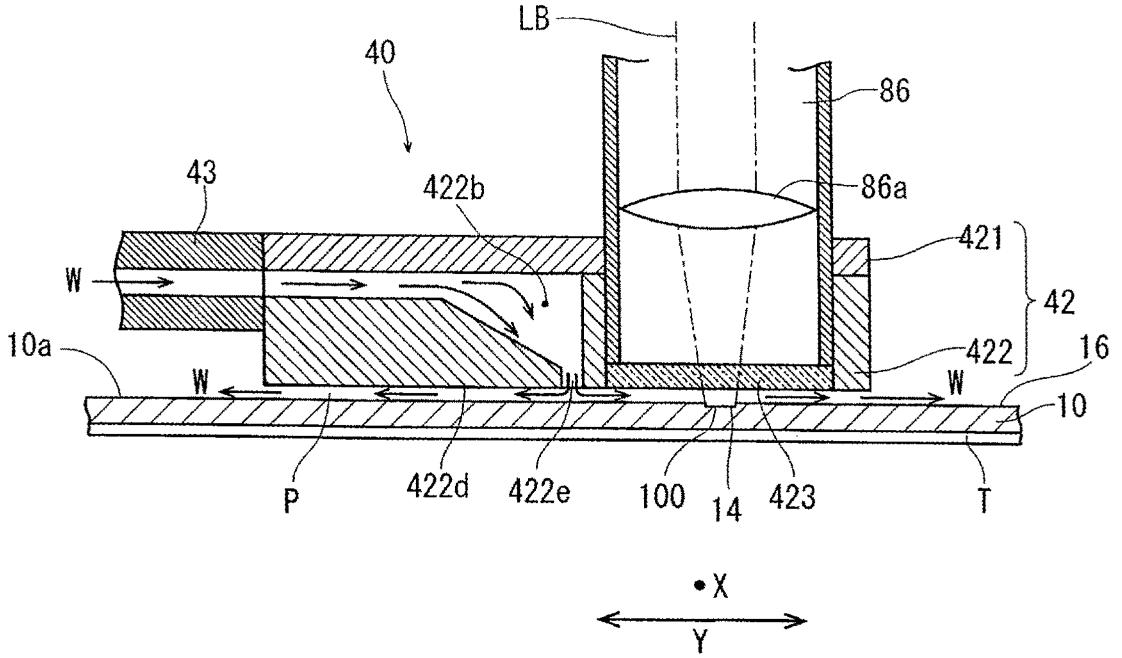
FIG. 6A is a cross-sectional view of the water film-forming unit and the wafer during the laser processing illustrated in FIG. 5.

After the wafer 10 has been held on the chuck table 34, the chuck table 34 is moved by the above-described moving mechanism 23 as needed to position the wafer 10 right below the alignment unit 88. After the wafer 10 has been positioned right below the alignment unit 88, the wafer 10 is imaged from above by the alignment unit 88. Based on an image of the wafer 10 as captured by the alignment unit 88, an alignment between a processing position (predetermined one of the streets 14) on the wafer 10 and the condenser 86 is next performed by a method such as pattern matching. By moving the chuck table 34 on the basis of position information acquired by this alignment, the condenser 86 is positioned together with the water film former 40 above the predetermined street 14 of the wafer 10 as illustrated in FIG. 5. Next, the condenser 86 is moved in the Z-axis direction by the unillustrated focal point position adjusting means, whereby the spot S is formed at a surface height of one end portion of the predetermined street 14 which is an application staring point by the pulsed laser beam LB on the wafer 10. FIG. 6A depicts a schematic cross-sectional view taken through the water film former 40 together with the wafer 10 in the Y-axis direction. As appreciated from FIG. 6A, the water film former 40 of the water film-forming unit 4 is disposed on the lower end portion of the condenser 86, and a clearance P of, for example, approximately 0.5 to 2.0 mm is formed between the bottom wall 422*d* of the casing 42 which makes up the water film former 40 and the front surface 10*a* of the wafer 10.

After the alignment between the condenser 86 and the wafer 10 has been performed, the water W is replenished to the water film-forming unit 4 as needed and sufficiently via the water recovery channel 70 of the water recovery pool 60, and the pump 44 is operated. The water W which circulates in the water film-forming unit 4 is, for example, pure water.

As the water film-forming unit 4 has the above-described configuration, the water W delivered from a delivery port 44*a* of the pump 44 is supplied to the water film former 40 via the pipe 46*a*. The water W supplied to the water film former 40 is ejected downward from the ejection port 422*e* formed in the bottom wall 422*d* of the casing 42 of the water film former 40. As illustrated in FIG. 6A, the water W ejected from the ejection port 422*e* forms a layer of the water W while filling up the clearance P formed between the bottom wall 422*d* of the casing 42 and the wafer 10, specifically, between the transparent portion 423 and the wafer 10. Thereafter, the water W flows downward, and is recovered in the water recovery pool 60. The water W recovered in the water recovery pool 60 is guided to the filter 45 by way of the above-described pipe 46*b*, is cleaned at the filter 45, and is returned to the pump 44. In this manner, the water W delivered by the pump 44 is allowed to circulate in the water film-forming unit 4.

Upon lapse of a predetermined time (several minutes, approximately) after initiation of operation of the water film-forming unit 4, the clearance P between the bottom wall 422*d* of the casing 42, specifically, the transparent portion 423 and the wafer 10 is filled up with the water W to form the layer of the water W, thereby creating a state in which the water W stably circulates in the water film-forming unit 4.

Figure 6B:
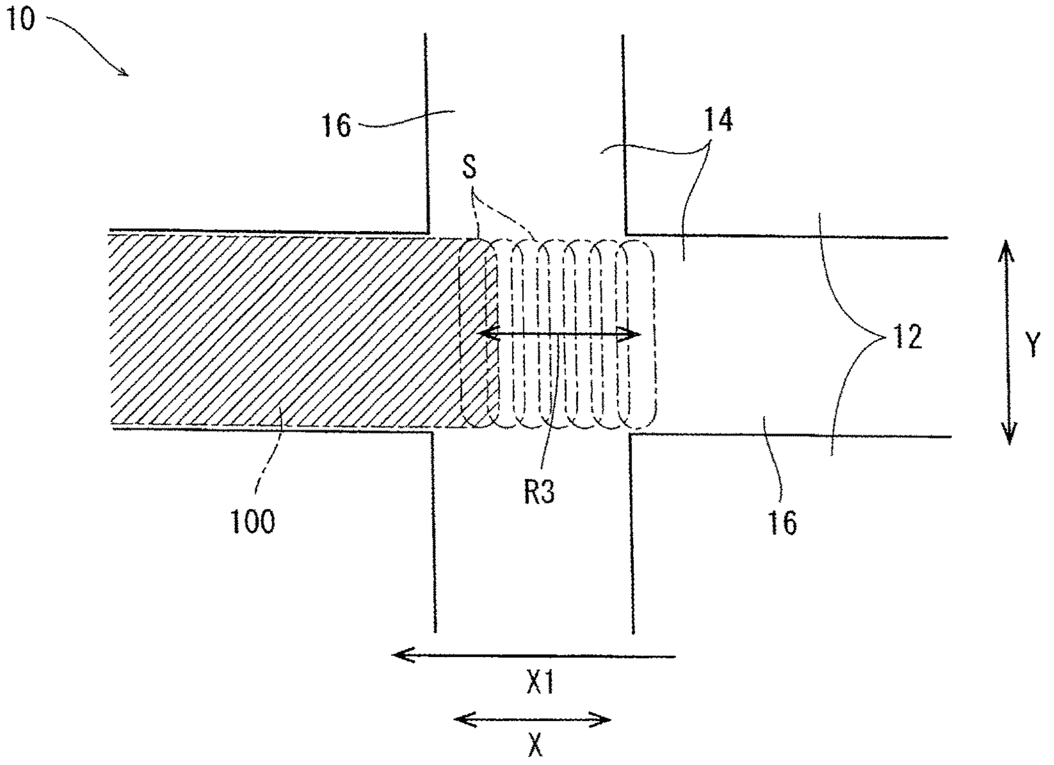
FIG. 6B is a plan view illustrating a manner in which the spot is dispersed in an X-axis direction during the laser processing illustrated in FIG. 6A.

With the water W stably circulating in the water film-forming unit 4, the X-axis direction feed mechanism 50 is operated while operating the laser beam application unit 8, whereby the chuck table 34 is moved at a predetermined moving speed in the X-axis direction (in a direction indicated by an arrow Xl in FIG. 5) that is the processing feed direction. The pulsed laser beam LB emitted from the condenser 86 passes through the transparent portion 423 and the layer of the water W, and is applied to the predetermined street 14 which is the processing position of the wafer 10. When the pulsed laser beam LB is applied to the wafer 10 as described above, the pulsed laser beam LB is dispersed in the X-axis direction owing to the above-described rotation of the polygon mirror 91 as illustrated in FIG. 6B. As a result, in a state in which the spot S is dispersed and the pulsed laser beam LB is applied to the spot S as indicated by an arrow R3 on the predetermined street 14 along the X-axis direction on the wafer 10, the wafer 10 is moved in the direction indicated by the arrow X1.

The above-described laser processing conditions for the laser processing machine 2 can be realized, for example, under the following specific processing conditions.

Wavelength of pulse laser beam: 355 nm
Average output: 11 W
Repetition frequency: 2.7 MHz
Processing feed rate: 100 mm/s Subsequent to the application of the pulsed laser beam LB to a predetermined one of the mirrors M, the pulsed laser beam LB is applied to a next one of the mirrors M, the next mirror M being located on a downstream side with respect to a rotation direction of the polygon mirror 91 as indicated by the arrow R1, so that the pulsed laser beam LB is continuously dispersed and applied to the wafer 10. While the pulsed laser beam LB is emitted from the laser oscillator 81 and the polygon mirror 91 is rotated as described above, laser processing is performed along the streets 14. Here, it is to be noted that, in the present embodiment, the profile of the spot S of the pulsed laser beam LB is shaped to be long in the Y-axis direction and short in the X-axis direction on each street 14 of the wafer 10 as described based on FIGS. 4A and 4B. Especially, in the present embodiment, the spot S is shaped in such a manner as to, corresponding to the width (55 μm) of the streets 14, have a length of 50 μm in the Y-axis direction. In other words, without needing to apply the pulsed laser beam LB to each single street 14 while relatively and repeatedly moving the wafer 10 held on the holding unit 22 and the laser beam application unit 8 in the X-axis direction, an insulating layer 16 on the street 14 can be efficiently removed in a wide range to form a processed groove 100 by a single stroke of laser processing.

After the above-described laser processing has been performed along the predetermined single street, the above-described moving mechanism 23 is operated to position the condenser 86 above one end portion of the next street 14 which is adjacent in the Y-axis direction to the predetermined street 14 that has been already subjected to the laser processing and that extends in a first direction, the next street 14 having not been processed, and laser processing similar to the above-described laser processing is performed, whereby the insulating layer 16 on the next street 14 that extends in the first direction is removed to form another processed groove 100. After such laser processing has been performed along all the streets 14 extending in the same direction as the streets 14 subjected to the laser processing, the chuck table 34 is rotated by 90 degrees, and similar laser processing is also performed along the unprocessed streets 14 extending in a second direction that intersects at right angles the above-processed streets 14 in the first direction. In the manner as described above, the processed grooves 100 can be formed, with the insulating layer 16 removed, along all the streets 14 on the wafer 10.

After the processed grooves 100 have been formed along all the streets 14 on the wafer 10 as descried above in the present embodiment, the wafer 10 is transferred to a dicing machine a depiction of which is omitted in the figures, where the wafer 10 is cut along the streets 14 by a cutting blade disposed in the dicing machine to singulate the wafer 10 into individual device chips. In the present embodiment, the processed grooves 100 are formed, with the insulating layer 16 on the streets 14 having been efficiently removed, in the wide range (50 μm) corresponding to the width dimension (55 μm) of the streets 14 as described above. Formation of device chips through cutting of the streets 14 of the wafer 10 by a cutting blade of a thickness (for example, 30 μm) smaller than the width dimension of the streets 14 therefore eliminates the problem that peeling of the insulating layer may occur, may spread to the circuit layers of the devices 12, and may damage the devices 12.

When the above-described laser processing is performed, bubbles occur in the water W that is present at a position of the wafer 10 where the pulsed laser beam LB is applied. However, in the present embodiment, the water W is allowed to always flow at a predetermined flow rate through the clearance P formed over the wafer 10, as described based on FIG. 6A. As a consequence, bubbles occurred in a vicinity of an application position of the pulsed laser beam LB are allowed to promptly flow downward together with the water W out of the clearance P formed over the wafer 10, so that the bubbles are expelled. In particular, according to the present embodiment, the ejection port 422*e* formed in the bottom wall 422*d* of the casing 42 is formed at a position adjacent in the Y-axis direction to the transparent portion 423 also disposed in the bottom wall 422*d*, and in a slit shape extending in the processing feed direction. Owing to the configuration described above, the water W is supplied from the Y-axis direction that intersects at right angles the X-axis direction in which the pulse laser beam LB is dispersed, and removes the bubbles occurred at the position where the pulsed laser beam LB is applied. As a consequence, the pulsed laser beam LB can be applied to the wafer 10 without interference by bubbles occurred through laser processing, so that good ablation processing can be continuously performed.

In addition, owing to the continuous flow of the water W through the clearance P over the wafer 10, debris particles occurred and released into the water W through ablation processing are promptly expelled together with bubbles from the front surface 10*a* of the wafer 10. The water W with the above-described bubbles and debris particles contained therein is guided to the filter 45 via the pipe 46*b*, and the filtered water W is again supplied to the pump 44. Since the water W circulates in the water film-forming unit 4 as described above, debris particles, fine powder, dust, and the like are appropriately captured by the filter 45, and hence the water W is maintained in a clean state. The laser processing machine 2 of the present embodiment is provided with the water film-forming unit 4 as described above, and hence there is no need to apply a protective tape or a protective film of a water-soluble resin or the like to the front surface 10*a* of the wafer 10, leading to a further improvement in productivity.

In the embodiment described above, with respect to the profile of the spot S formed by the laser beam application unit 8, the length in the Y-axis direction is set at 50 μm corresponding to the width (55 μm) of the streets 14. The present invention is however not limited to such a length. When shaping the profile of the spot S by the spot shaper 83 disposed in the laser beam application unit 8, it is important to shape the spot S such that the spot S is dimensioned to be smaller than the width dimension of the streets 14 and to be greater than the thickness of a cutting blade to be used when the wafer 10 is singulated along the streets 14.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing machine comprising:

a chuck table configured to hold a workpiece;

a laser beam application unit configured to apply a pulsed laser beam to the workpiece held on the chuck table;

an X-axis direction feed mechanism configured to perform relative processing feed of the chuck table and the laser beam application unit in an X-axis direction; and a Y-axis direction feed mechanism configured to perform relative processing feed of the chuck table and the laser beam application unit in a Y-axis direction that intersects the X-axis direction at right angles, wherein the laser beam application unit includes a laser oscillator that oscillates pulsed laser and emits a pulsed laser beam, a spot shaper configured to shape a spot profile of the pulsed laser beam emitted from the laser oscillator such that the spot profile becomes long in the Y-axis direction and short in the X-axis direction, a polygon mirror that disperses, in the X-axis direction, the spot which has been shaped by the spot shaper, and a condenser that focuses, on the workpiece held on the chuck table, the pulsed laser beam which has been dispersed by the polygon mirror so that the spot profile in the Y-axis direction is oriented in a width direction of each of a plurality of intersecting streets formed on the workpiece.

2. The laser processing machine according to claim 1, wherein the workpiece is a semiconductor wafer with a plurality of devices formed in a front surface thereof divided by the plurality of intersecting streets, and the spot profile which has been shaped at the spot shaper has, in the Y-axis direction, a length corresponding to a width of the streets.

3. The laser processing machine according to claim 1, wherein the laser beam application unit further includes a water film-forming unit configured to form a water film between the condenser and the workpiece held on the chuck table.

* * * * *